United States Patent
Welches et al.

(10) Patent No.: US 12,166,326 B1
(45) Date of Patent: Dec. 10, 2024

(54) FIBER LASER WITH OPTICAL FEEDBACK FOR CONTAMINANT DETECTION AND OTHER FUNCTIONALITY

(71) Applicant: InnoVoyce LLC, Boston, MA (US)

(72) Inventors: Richard Shaun Welches, Townsend, MA (US); Stephen Neal Mais, Boston, MA (US); James Cho, Westford, MA (US); Brandon Gallipoli, Marlborough, MA (US); Jack O'Reilly, Worcester, MA (US)

(73) Assignee: InnoVoyce LLC, Boston, MA (US)

( * ) Notice: Subject to any disclaimer, the term of this patent is extended or adjusted under 35 U.S.C. 154(b) by 0 days.

(21) Appl. No.: 18/662,698

(22) Filed: May 13, 2024

Related U.S. Application Data

(60) Provisional application No. 63/604,618, filed on Nov. 30, 2023.

(51) Int. Cl.
*H01S 3/00* (2006.01)
*G01M 11/02* (2006.01)

(52) U.S. Cl.
CPC ....... *H01S 3/0014* (2013.01); *G01M 11/0285* (2013.01)

(58) Field of Classification Search
CPC ............... G01M 11/0285; H01S 3/094069
USPC .................................................. 372/6
See application file for complete search history.

(56) References Cited

U.S. PATENT DOCUMENTS

| | | |
|---|---|---|
| 5,098,427 A | 3/1992 | Hessel et al. |
| 6,932,809 B2 | 8/2005 | Sinofsky |
| 7,006,749 B2 | 2/2006 | Illich et al. |
| 7,305,163 B2 | 12/2007 | Williams |
| 7,455,638 B2 | 11/2008 | Ogawa et al. |

(Continued)

FOREIGN PATENT DOCUMENTS

| | | |
|---|---|---|
| CN | 105664372 B | 6/2018 |
| CN | 110426782 A | 8/2019 |

(Continued)

OTHER PUBLICATIONS

NIR Detector, FTO Search Results, dated Oct. 4, 2023, 50 pages.
NIR Detector, Patentability Search Results, dated Oct. 4, 2023, 36 pages.

*Primary Examiner* — Tuan N Nguyen
(74) *Attorney, Agent, or Firm* — Morgan, Lewis & Bockius LLP

(57) ABSTRACT

The present disclosure relates to a laser device configured to detect material contamination and respond accordingly, thereby minimizing contaminant ignition and damage resulting therefrom. The laser device includes a laser source, an optical waveguide with first and second ends, and control circuitry that includes a photodetector and a comparator. The optical waveguide is configured to transmit a laser beam received from the laser source and further configured to receive light caused by contaminant ignition. The control circuitry is configured to detect an amount of said light after it is received by the optical waveguide, transmitted therethrough, and finally received at the photodetector. The control circuitry is further configured to determine whether the amount of light satisfies a shutdown threshold and then cause the laser source to stop emitting the laser beam if the shutdown threshold is satisfied.

27 Claims, 3 Drawing Sheets

(56) References Cited

U.S. PATENT DOCUMENTS

| | | | |
|---|---|---|---|
| 7,869,016 | B2 | 1/2011 | Mitchell et al. |
| 8,294,879 | B2 | 10/2012 | Silny et al. |
| 8,455,025 | B2 | 6/2013 | Stern et al. |
| 8,475,025 | B2 | 7/2013 | Ott et al. |
| 8,638,428 | B2 | 1/2014 | Brown |
| 8,740,958 | B2 | 6/2014 | Anderson et al. |
| 8,790,253 | B2 | 7/2014 | Sunagawa et al. |
| 8,956,343 | B2 | 2/2015 | Belikov et al. |
| 9,134,171 | B2 | 9/2015 | Blomster et al. |
| 9,216,059 | B2 | 12/2015 | Rink et al. |
| 9,259,270 | B2 | 2/2016 | Brown |
| 9,267,330 | B2 | 2/2016 | Rinzler et al. |
| 9,314,303 | B2 | 4/2016 | Brown |
| 10,135,216 | B1 | 11/2018 | Brown |
| 10,267,739 | B2 * | 4/2019 | Dantus .................. G01N 21/65 |
| 10,420,458 | B2 | 9/2019 | Sinofsky |
| 10,591,657 | B2 | 3/2020 | Kadokura et al. |
| 10,617,470 | B2 | 4/2020 | Xuan et al. |
| 10,667,863 | B2 | 6/2020 | Chia et al. |
| 10,702,338 | B2 | 7/2020 | Shazly et al. |
| 11,549,651 | B2 | 1/2023 | Krijn et al. |
| 2007/0016176 | A1 | 1/2007 | Boutoussov et al. |
| 2007/0239232 | A1 | 10/2007 | Kurtz et al. |
| 2009/0149845 | A1 * | 6/2009 | Brown .................. A61B 18/24 606/12 |
| 2009/0177191 | A1 | 7/2009 | Brown |
| 2011/0249692 | A1 * | 10/2011 | Honea ................ G02B 6/02366 372/29.011 |
| 2012/0232534 | A1 | 9/2012 | Rink et al. |
| 2017/0042618 | A1 | 2/2017 | Brown |
| 2017/0231553 | A1 | 8/2017 | Igarashi et al. |
| 2019/0076668 | A1 | 3/2019 | McLay-Brown et al. |
| 2021/0000567 | A1 | 1/2021 | Sutter et al. |
| 2022/0094132 | A1 | 3/2022 | Sakamoto et al. |
| 2022/0117649 | A1 | 4/2022 | Reiterer et al. |
| 2022/0133172 | A1 | 5/2022 | Ransbury et al. |
| 2024/0016543 | A1 | 1/2024 | Altshuler et al. |

FOREIGN PATENT DOCUMENTS

| | | | |
|---|---|---|---|
| CN | 112864784 | A | 5/2021 |
| CN | 218885370 | U | 4/2023 |
| CN | 116407270 | A | 7/2023 |
| EP | 0424272 | A2 | 10/1990 |
| EP | 0844472 | A1 | 5/1998 |
| EP | 1204850 | A1 | 2/2001 |
| EP | 2736439 | B1 | 6/2014 |
| EP | 4179600 | A1 | 2/2022 |
| JP | 2001149380 | A | 6/2001 |
| JP | 3695901 | B2 | 9/2005 |
| JP | 2014200815 | A | 10/2014 |
| JP | 2015065302 | A | 4/2015 |
| JP | 2015199117 | A | 11/2015 |
| JP | 2016191895 | A | 11/2016 |
| JP | 7145630 | B2 | 10/2022 |

* cited by examiner

FIBER LASER WITH OPTICAL FEEDBACK FOR CONTAMINANT DETECTION AND OTHER FUNCTIONALITY

PRIORITY

The present application claims priority to U.S. Provisional App. No. 63/604,618 (filed Nov. 30, 2023), which is hereby incorporated by reference.

TECHNICAL FIELD

The present disclosure relates, generally, to laser technologies and, more specifically, to fiber lasers for use in surgery, biomedicine, and other pertinent fields.

BACKGROUND

In recent years, fiber optic lasers have revolutionized surgical procedures, offering unprecedented levels of precision and flexibility. Whereas traditional surgical techniques often required large incisions, fiber lasers allow surgeons to minimize tissue trauma during surgery. Additionally, the flexibility and small size of fiber lasers allow surgeons to access to hard-to-reach areas within the body, expanding the scope of potential surgical interventions.

Notwithstanding many advancements in the field, there remain opportunities for further improvements to fiber laser technologies. State-of-the-art surgical lasers still struggle, for instance, with overheating and device failure due to contamination accrued during surgery. Additional development to fiber laser technologies promises to further aid surgeons in conducting surgeries therewith, as well as all others that employ fibers lasers in their respective fields.

SUMMARY

The present disclosure offers various improvements to current fiber laser technologies. These improvements seek primarily to prevent issues that arise when contamination accrues at the emitting end of a fiber laser and eventually ignites. Contamination often occurs during surgical procedures, for instance, when the tip of a fiber laser inadvertently comes into contact with human tissue, bodily fluid, or carbon from a previous laser incision.

The contaminants themselves are not problematic. However, contaminant ignition can cause serious damage to the laser fiber, risk patient harm, and complicate surgery. Due to the high power output of the laser, accrued contaminants are at risk of ignition. Ignited contaminants can reach temperatures well above 1,000 degrees Celsius, which results in rapid melting of the laser fiber. Thus, quick detection of and response to contamination ignition is paramount to improving surgical procedures involving fiber lasers.

Discussed in more detail below, the subject technology involves a laser device configured to detect contaminant ignition based on broadband light produced by the contaminants as they begin to ignite. In order to ensure proper detection, this device relies on visible light caused by ignition rather than infrared light, which may be produced prior to ignition by the high temperatures of the laser fiber or contaminants accrued thereon. Example embodiments include the following:

A laser device includes a laser source, an optical waveguide (e.g., an optical fiber), and control circuitry. The laser source is configured to emit a laser beam. The optical waveguide includes first and second ends and is configured to emit the laser beam at the second end after receiving the laser beam at the first end. The optical waveguide is further configured to emit light at the first end after receiving the light at the second unit. The control circuitry includes a photodetector and a comparator. The control circuitry is configured to detect an amount of light received at the photodetector after the light is emitted from the first end of the optical waveguide. The control circuitry is also configured to determine, using the comparator, whether the amount of light satisfies a shutdown threshold. Additionally, the control circuitry is configured to, responsive to determining that the amount of light satisfies the shutdown threshold, cause the laser source to stop emitting the laser beam.

A computer-implemented method for operating a laser device configured to detect contaminant ignition and respond thereto, the method including causing a laser source of a laser device to emit a laser beam. The laser device includes an optical waveguide (e.g., a fiber optic) with first and second ends, and it is configured to emit the laser beam at the second end after receiving the laser beam at the first end. The optical waveguide is further configured to emit light at the first end after receiving the light at the second end. In addition to causing the laser source to emit the laser beam, the method also includes detecting an amount of light received at a photodetector of control circuitry of the laser device after the light is emitted from the first end of the optical waveguide. Additionally, the method includes determining, using a comparator of the control circuitry, whether the amount of light satisfies a shutdown threshold, and, responsive to determining that the amount of light satisfies the shutdown threshold, causing the laser source to stop emitting the laser beam.

A non-transitory, computer-readable medium storing instructions that, when executed by a processor of a laser device, cause the laser device to perform operations including causing a laser source of a laser device to emit a laser beam. The laser device includes an optical waveguide (e.g., a fiber optic) with first and second ends, and it is configured to emit the laser beam at the second end after receiving the laser beam at the first end. The optical waveguide is further configured to emit light at the first end after receiving the light at the second end. In addition to causing the laser source to emit the laser beam, the operations also include detecting an amount of light received at a photodetector of control circuitry of the laser device after the light is emitted from the first end of the optical waveguide. Additionally, the operations include determining, using a comparator of the control circuitry, whether the amount of light satisfies a shutdown threshold, and, responsive to determining that the amount of light satisfies the shutdown threshold, causing the laser source to stop emitting the laser beam.

A method of manufacturing a laser device, the method including providing a laser source configured to emit a laser beam. The method also includes providing an optical waveguide (e.g., a fiber optic) with first and second ends, where the optical waveguide is configured to emit the laser beam at the second end after receiving the laser beam at the first end and also to emit light at the first end after receiving the light at the second end. Additionally, the method includes providing control circuitry that includes a photodetector and a comparator. The control circuitry is configured to detect an amount of light received at the photodetector; determine, using the comparator, whether the amount of light satisfies a shutdown threshold; and, responsive to determining that the amount of light satisfies the shutdown threshold, cause the laser source to stop emitting the laser beam. Further, the method includes positioning the laser source relative to the optical waveguide such that the laser beam is received at the first end of the optical waveguide after the laser beam is emitted by the laser source. Moreover, the method includes positioning the first end of the optical waveguide relative to the photodetector such that the light is received at the photodetector after the light is emitted by the first end of the optical waveguide. Furthermore, the method includes connecting the control circuitry to the laser source such that the control circuitry can cause the laser source to stop emitting the laser beam.

Other configurations of the subject technology will be apparent to those skilled in the art from the detailed description below, which describes various configurations of the subject technology and illustrations thereof. The subject technology is capable of other and different configurations, and its several details are capable of modification in various other respects, all without departing from the scope of the subject technology. Thus, the Drawings and Detailed Description are presented as illustrative in nature and should not be construed as restricting the present disclosure.

BRIEF DESCRIPTION OF THE DRAWINGS

For a better understanding of the present disclosure, reference should be made to the Detailed Description, below, in conjunction with the following drawings. Like reference numerals refer to corresponding parts throughout the figures and the description.

DETAILED DESCRIPTION

Figure 1A:
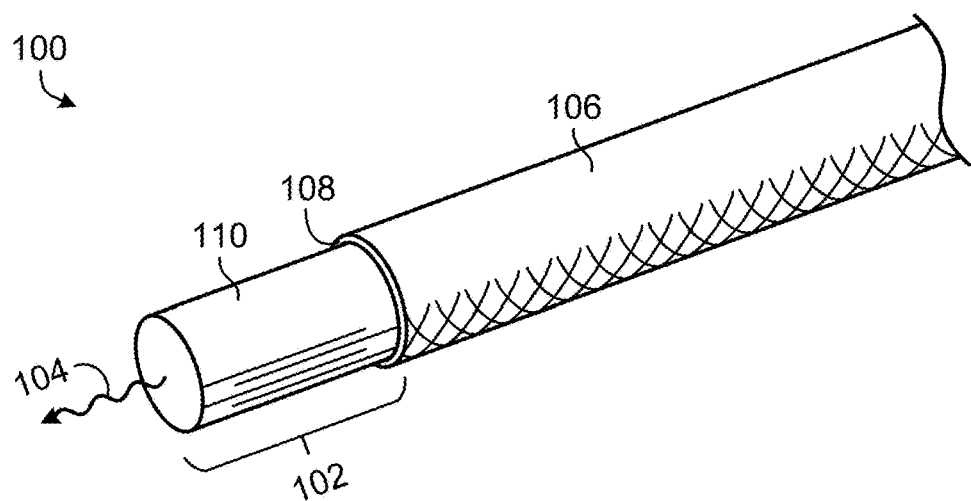
FIGS. 1A through 1C illustrate an optical waveguide of an example laser device, according to various aspects of the subject technology.
Figure 1B:
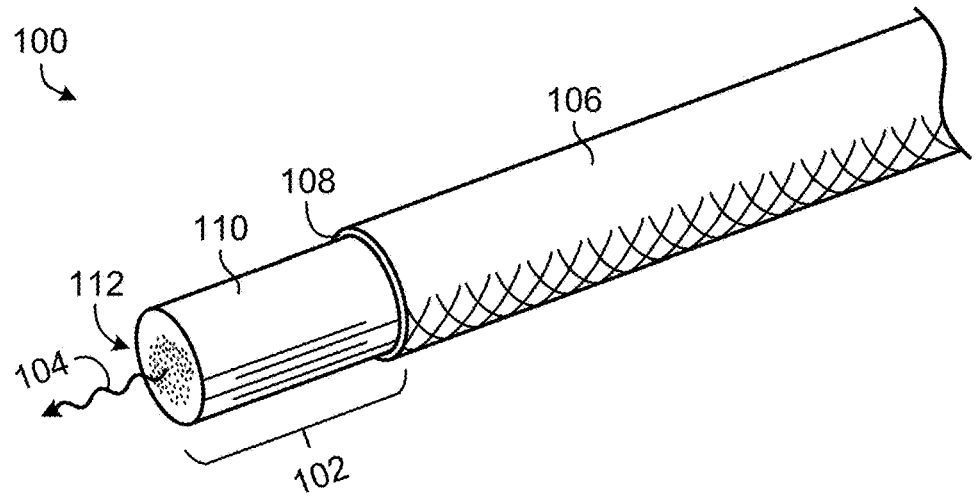
Figure 1C:
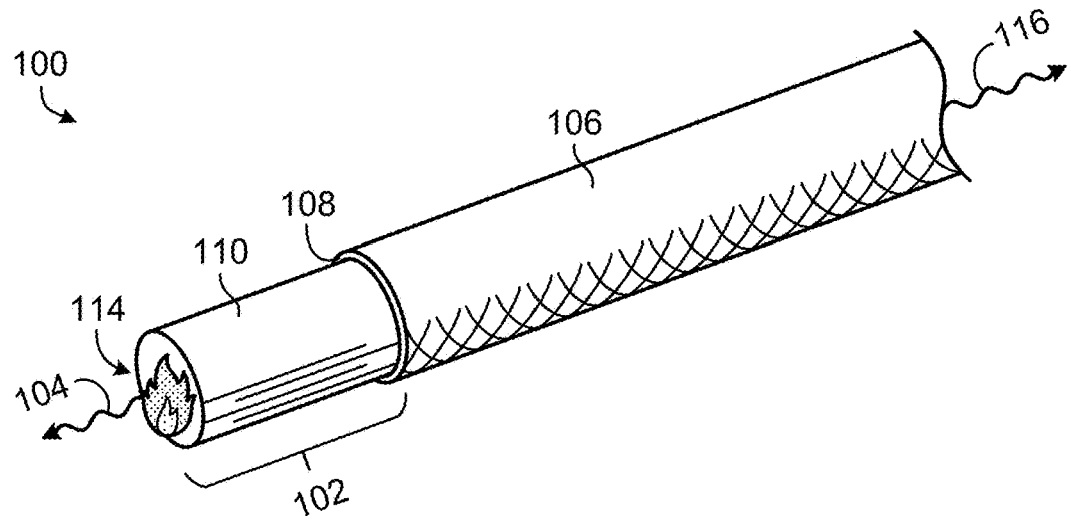

FIGS. 1A through 1C illustrate an optical waveguide 100 (e.g., a fiber optic) of an example laser device (e.g., laser device 200, below), according to various aspects of the subject technology. Together, these figures illustrate standard operation of the optical waveguide 100 (FIG. 1A), contamination of the optical waveguide 100 (FIG. 1B), and ignition of the contaminated optical waveguide 100 (FIG. 1C).

As illustrated in FIG. 1A, in some embodiments, the optical waveguide 100 includes an outer buffer layer 106, a cladding layer 108, and a core 110. In some embodiments, the optical waveguide 100 is a fiber optic cable, with the core 110 including one or more fiber optic strands. During standard operation, the optical waveguide emits a laser beam 104 from the illustrated end portion 102 of the optical waveguide 100.

Oftentimes, contaminants 112 such as tissue or fluids accrue on the end 102 of the optical waveguide 100, especially during surgical procedures. This is illustrated in FIG. 1B. These contaminants 112 are at risk of igniting due to the power of the laser beam 104, with FIG. 1C illustrating ignition resulting in flames 114. Ignition can cause significant damage to the optical waveguide 100, not to mention injury to the patient undergoing surgery. Accordingly, disabling the optical waveguide following ignition is important to preserving the optical waveguide 100 and ensuring patient safety.

The subject technology relies on light 116 emitted by the flames 114, shown in FIG. 1C as traveling backwards up the length of the optical waveguide 100. Indicative of ignition, this light 116 can be detected after it exits the other end of the optical waveguide (i.e., the end opposite end 102) and used as a flag for terminating emission of the laser beam 104. In this manner, the subject technology helps to minimize damage caused by contaminant ignition.

Figure 2:
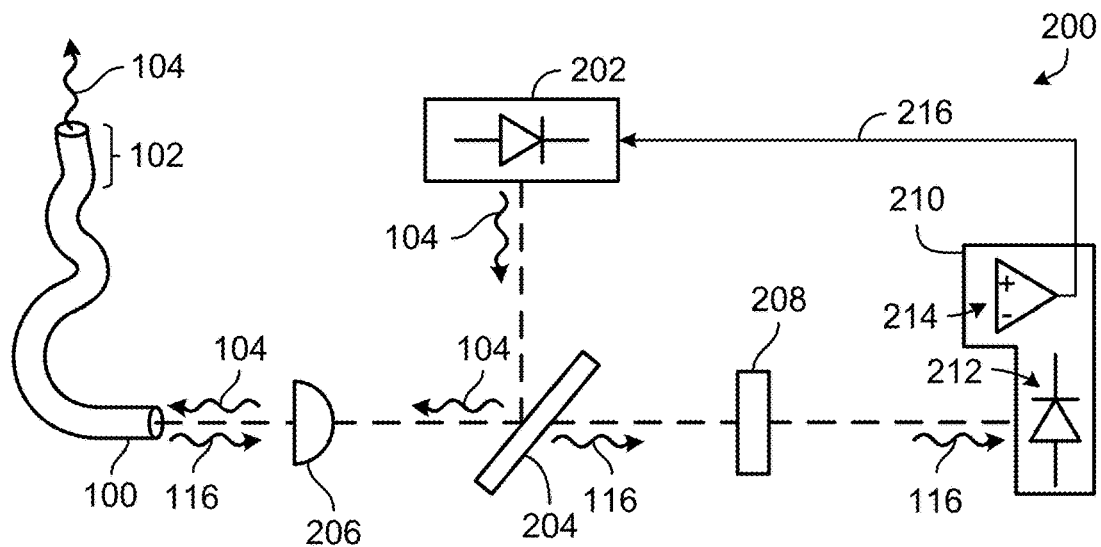
FIG. 2 illustrates components of an example laser device, according to various aspects of the subject technology.

FIG. 2 illustrates internal components of an example laser device, according to various aspects of the subject technology. The device 200 includes the aforenoted optical waveguide 100, as well as a laser source 202 configured to emit the laser beam 104, a selective turning mirror 204 configured to reflect the laser beam 104 but transmit light 116 emitted by ignited contaminants (see contaminants 112 and flames 114, above), a focusing lens 206 configured to focus the laser beam 104, an optical filter 208 configured to reflect the laser beam 104 but transmit the light 116, and control circuitry 210 with a photodetector 212 and a comparator 214. In some embodiments, the selective turning mirror 204 and the optical filter 208 are further configured to reflect infrared light, as well as other non-visible light.

In the illustrated embodiment, the components are positioned such that after the laser source 202 emits the laser beam 104, the beam 104 is reflected off of the selective turning mirror 204, focused by the focusing lens 206, received at a first end of the optical waveguide 100, and finally emitted from the second end 102 of the optical waveguide 100. From there, the laser beam 104 can be harnessed by a user of the laser device 200 to cut tissue, and so on.

In a surgical scenario, for instance, the latter end 102 of the optical waveguide 100 can be directed towards a surgery site via an endoscope, via a handpiece, or while held in a surgeon's hand. In many cases the second end 102 of the optical waveguide is placed mere millimeters above the site in order to focus the laser beam 104 while avoiding direct contact of the end 102 of the optical waveguide 100 with the site. From there, the surgeon can adjust the distance between the end 102 of the optical waveguide 100 and the site to control the irradiance or fluence deposited onto the site, where moving the end 102 of the optical waveguide 100 closer to the site results in increased fluence and increased irradiance. In some instances, the surgeon may place the end 102 of the optical waveguide 100 in direct contact with the site in order to maximize energy intensity. This is most often done to perform a cut in tissue (e.g., to excise a tumor). It is noted that the second end 102 of the optical waveguide 100 may be a bare fiber laser (e.g., without a fiber cap). Such an embodiment may be better suited for use in detecting contaminant ignition because a fiber cap may cause additional light from the laser beam 104 to reflect up the length of the optical waveguide 100 and towards the photodetector 212, discussed below. However, in some embodiments, the optical waveguide 100 includes a fiber cap.

In many instances, the laser source 202 operates at a relatively high power (e.g., 10-30 W) and with a small diameter in order to ensure effective incisions. The combination of these factors means that contamination on the end 102 of the optical waveguide 100 is particularly likely to ignite, especially when the laser device 200 is operated in a continuous wave, quasi-continuous wave, or continuous emission mode. Though lower power (e.g., 4-5 W) lasers are less likely to ignite contamination, these lasers also tend to be less effective in surgery.

Upon ignition, the contaminants cause broadband light to propagate back up the optical waveguide 100 and through the focusing lens 206, whereat the light scatters within the laser device 200. This light can be detected nearly instantaneously by the photodetector 212 inside the laser device 200. In order to minimize noise due to the laser beam 104, the selective turning mirror 204 and the optical filter 208 can each be configured and positioned to reflect or absorb the laser beam 104 while allowing the broadband light to travel therethrough and towards the photodetector 212. Thus, the mirror 204 and the filter 208 can help to increase the integrity of light measurements collected by the photodetector 212.

In some embodiments, the laser beam 104 comprises monochromatic light with a power output of roughly 20 watts (e.g., ±10 W) and a wavelength of approximately 455 nanometers (e.g., ±10 nm). Accordingly, the selective turning mirror 204 and the optical filter 208 can be configured to reflect or absorb light of the wavelength of the laser beam 104 while allowing broadband light 116 caused by ignition of contamination to pass through the mirror 204 and the filter 208. The broadband light 116 that may include wavelengths that are greater than the wavelength of the laser beam 104. For instance, the broadband light may include light having one or more wavelengths between 480 to 880 nanometers, and the mirror 204 and filter 208 can be configured to transmit this light 116. In other embodiments, the power output of the laser beam 10 is as high as 60 watts. In such embodiments, the selective turning mirror 204 and the optical filter are likewise configured to reflect or absorb the laser beam 104 while still allowing light 116 caused by contaminant ignition to pass therethrough.

In some embodiments, the selective turning mirror 204 is configured to reflect 455 nanometer (e.g., ±10 nm) light and transmit light with a wavelength between approximately 495 and 875 nanometers (e.g., ±10 nm). Additionally, in some embodiments, the optical filter 208 comprises an edge pass filter with a cut-off at approximately 465 nanometers (e.g., ±10 nm) (e.g., attenuating 455 nm light to prevent photodetector 212 saturation). Further, in some embodiments, the photodetector 212 is a silicon photodiode configured to detect light with wavelengths between approximately 480 and 1100 nanometers (e.g., ±10 nm).

As the light 116 is received at the photodetector 212, the photodetector 212 provides a signal to the comparator 214 indicative of the amount of light received at the photodetector 212. For example, in some embodiments, the photodetector 212 generates a voltage proportionate to the amount of light received thereat. The comparator 214 then determines whether the amount of light detected by the photodetector 212 satisfies (e.g., meets, exceeds) a given threshold. In some embodiments, this involves comparing a voltage received from the photodetector 212 to a reference voltage, as discussed in more detail with respect to FIG. 3.

If the amount of light satisfies the threshold, then the control circuitry 210 transmits a laser-inhibit signal 216 to the laser source 202, which causes the laser source 202 to stop transmitting the laser beam 104. In some embodiments, this involves the control circuitry 210 triggering a latched laser-inhibit signal, which results in near-instantaneous shut-off of the laser beam 104. In some embodiments, it involves the control circuitry 210 sending a shutoff instruction to the laser beam 104. In either event, quickly disabling the laser beam 104 can prevent damage (e.g., melting) to the laser device 200 and to the patient.

Additionally, if the amount of light satisfies the threshold, the control circuitry 210 can also transmit a message (e.g., display a notification, trigger an alarm, send a text message) to a user regarding the contamination and the detected ignition. In some embodiments, this message advises the user that the end 102 of the optical waveguide 100 should be inspected and either cleaned or stripped and re-cleaved. In some embodiments, the laser device 200 will not re-initiate the laser source 202 until after receiving confirmation from the user that the contamination has been removed from the optical waveguide 100. However, in some embodiments, the user can simply re-activate the laser source 202 by overriding the instruction.

Figure 3A:
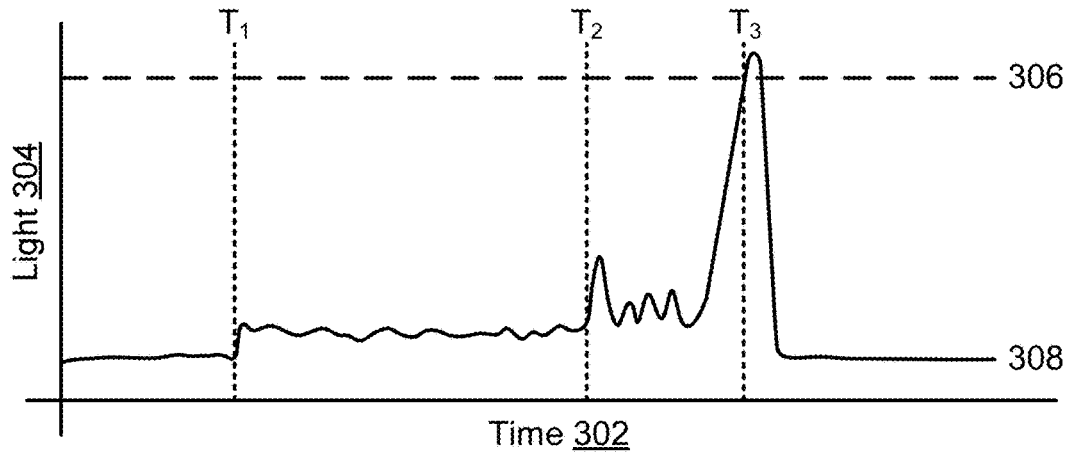
FIGS. 3A and 3B illustrate example signals from a photodetector of a laser device, according to various aspects of the subject technology.
Figure 3B:
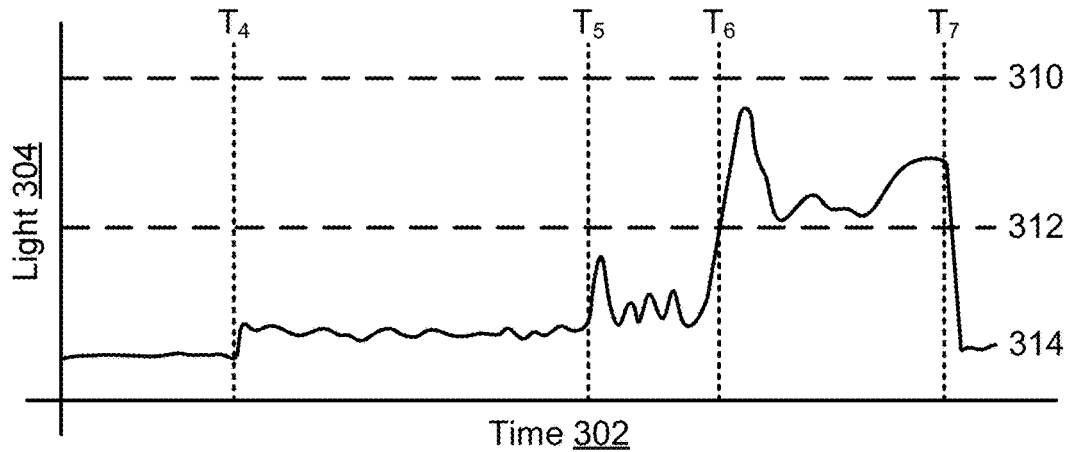

FIGS. 3A and 3B illustrate example signals 308 and 314 from a photodetector (e.g., photodetector 212) of a laser device (e.g., laser device 200), according to various aspects of the subject technology. The magnitude of each signal 308 and 314 corresponds to an amount of light received at the photodetector (see y-axis 304), which varies over time (see x-axis 302) during operation of the laser device.

In FIG. 3A, up until $T_1$, the amount of light 308 detected by the photodetector stays fairly constant while the laser device is not emitting a laser beam (e.g., laser beam 104). Then, at $T_1$, the laser device begins emitting a laser beam and the amount of light 308 increases as a result. Though the laser device can include filters (e.g., optical filter 208) and other components (e.g., selective turning mirror 204) to prevent laser light from reaching the photodetector, some amount of leakage is to be expected.

Between $T_1$ and $T_2$, the amount of light 308 again stays fairly constant during standard operation of the laser device. However, at $T_2$, that amount 308 begins to fluctuate and eventually increases until around $T_3$. During this period of time, contaminants on the end (e.g., end 102) of an optical waveguide (e.g., optical waveguide 100) of the laser device are beginning to ignite. As a result, light (e.g., light 116) from the ignition travels up through the optical waveguide and into the laser device, eventually reaching the photodetector.

At time $T_3$, the ignited contaminants emit enough light such that the amount of light 308 received at the photodetector exceeds a shutdown threshold 306. Accordingly, control circuitry (e.g., control circuitry 210) in the laser device causes the laser source to stop emitting the laser beam, the contaminants stop burning and emitting light as a result, and the amount of light 308 received at the photodetector returns to a level similar to the amount of light 308 received during the time period prior to $T_1$.

FIG. 3B similarly illustrates an amount of light 314 received at the photodetector prior to emission of the laser beam (i.e., prior to $T_4$), during emission of the laser beam but prior to ignition of contaminants on the optical waveguide (i.e., from $T_4$ to $T_5$), and during ignition of the contaminants (i.e., from $T_5$ to $T_6$). In FIG. 3B, however, the light emitted by contaminant ignition is less intense and therefore insufficient to cause the amount of light 314 to exceed the shutdown threshold 310.

Though the amount of light 314 does not cross the shutdown threshold 310, the amount of light 314 does cross a delayed-shutdown threshold 312 that is less than the shutdown threshold 310 at time $T_6$. Unlike the shutdown threshold 310, crossing the delayed-shutdown threshold 312 does not trigger an immediate response from the aforenoted control circuitry. Rather, the control circuitry waits to respond to the amount of light 314 until after it has crossed the delayed-shutdown threshold 312 for a predetermined amount of time (e.g., just prior and up to $T_7$). Thereafter, at $T_7$, the control circuitry causes the laser source to stop emitting the laser beam. And, as with FIG. 3A, terminating emission of the laser beam eventually causes the contaminants to stop burning and emitting light, and the amount of light 314 received at the photodetector returns roughly to pre-$T_4$ levels.

Figure 4:
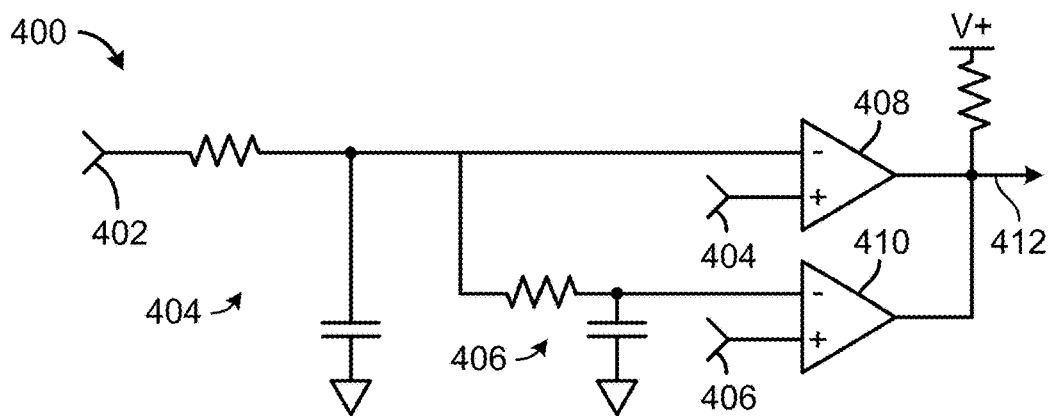
FIG. 4 illustrates an example voltage comparator circuit for use in a laser device, according to various aspects of the subject technology.

FIG. 4 illustrates an example voltage comparator circuit 400 (e.g., comparator 214) for use in a laser device (e.g., laser device 200), according to various aspects of the subject technology. In some embodiments, this circuit 400 is used to determine whether an amount of light (e.g., amounts of light 308 and 314) received at a photodetector (e.g., photodetector 212) exceeds one or more thresholds.

In the illustrated embodiment, the circuit 400 receives an amplified signal 402 from a photodetector, where the signal 402 corresponds to an amount of light received at the photodetector. The circuit 400 compares this signal 402 to two reference voltages using first and second comparators 408 and 410, respectively. In some embodiments, the first comparator 408 quickly determines whether the signal 402 exceeds the first reference voltage. And, in some embodiments, the second comparator 410 determines whether the signal 402 exceeds the second reference voltage, but it does so more slowly than the first comparator 408. In some embodiments, the reference voltages associated with the first and second comparators 408 and 410 correspond, respectively, to shutdown and delayed-shutdown thresholds. These thresholds are discussed in more detail below with respect to FIG. 5.

In any event, once the first or second comparator 408 or 410 determines that the signal 402 exceeds the respective reference voltage, the comparator causes the circuit 400 to output a laser-inhibit signal 412 that causes the laser source to stop emitting the laser beam.

The circuit 400 also includes two resistor-capacitor (RC) pairs 404 and 406. The first RC pair 404 filters noise for the first and second comparators 408 and 410. The second RC pair 406 adds a time delay to the second comparator 410 such that the second comparator 410 will not emit a signal (i.e., a logic "1") unless the voltage input to the second comparator 410 satisfies the corresponding voltage threshold for a predetermined amount of time.

Another feature of the at least two ignition detector comparators is the capability of capturing a lower magnitude of visible light from ignited contamination on or even adjacent to the fiber tip surface for example where contamination extends over the edge of the fiber tip surface and becomes ignited and where resulting visible light emissions are thusly reduced. For example, fiber tip surface adjacent portions of the fiber optic cladding or even the buffer layer and contamination thereupon may become ignited. The lower threshold comparator (which uses a threshold too low for normal use during therapy and may therefore trigger falsely) makes use of a time delay with the lower threshold to detect low magnitude ignition or ignited material on or over the edge of the fiber tip surface.

Figure 5:
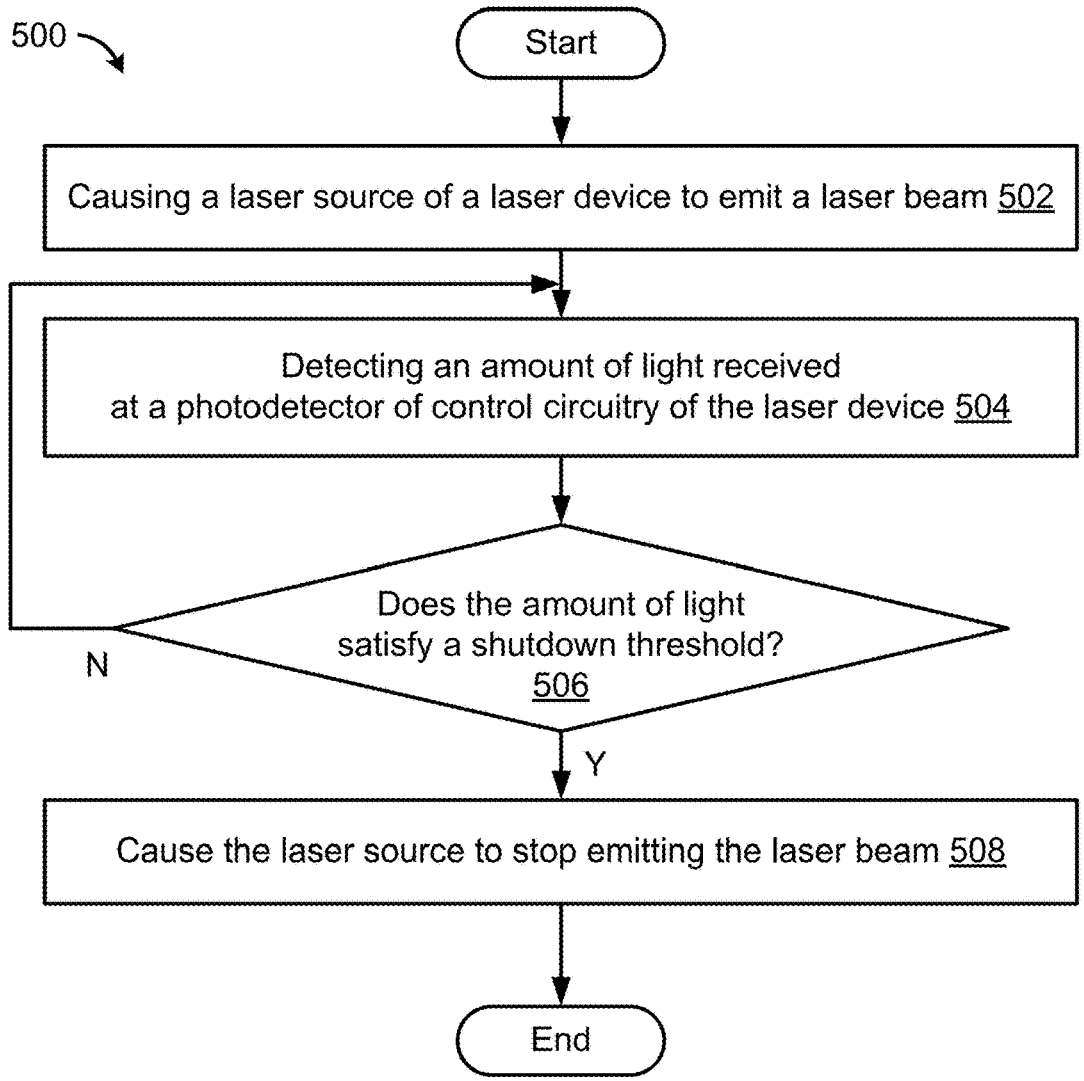
FIG. 5 illustrates an example process for operation of a laser device configured to detect contaminant ignition and respond thereto, according to various aspects of the subject technology.

FIG. 5 illustrates an example process 500 for operation of a laser device configured to detect contaminant ignition and respond thereto, according to various aspects of the subject technology. The operations of the process 500 can be carried out by hardware such as that discussed above with respect to FIGS. 1 through 4, including the control circuitry 210 of FIG. 2 and the voltage comparator circuit 400 of FIG. 4. However, the process 500 can also be executed by a processor configured to execute instructions stored in a non-transitory, computer-readable medium.

As illustrated, the process 500 includes causing (502) a laser source (e.g., laser source 202) of a laser device (e.g., laser device 200) to emit a laser beam (e.g., laser beam 104). The laser device includes an optical waveguide (e.g., optical waveguide 100) with first and second ends. Additionally, the optical waveguide is configured to emit the laser beam at the second end (e.g., emitting end 102) after receiving the laser beam at the first end. Similarly, the optical waveguide is configured to emit light (e.g., light 116) at the first end after receiving light at the second end.

The process 500 also includes detecting (504) an amount of light (e.g., amount of light 308 or 314) received at a photodetector (e.g., photodetector 212) of control circuitry (e.g., control circuitry 210) of the laser device after the light is emitted from the first end of the optical waveguide. Additionally, the process 500 includes determining (506), using a comparator (e.g., using comparator 214 or first comparator 408 of voltage comparator circuit 400), whether the amount of light satisfies a shutdown threshold (e.g., threshold 306). Further, the process 500 includes causing (508) the laser source to stop emitting the laser beam (e.g., by sending a laser-inhibit signal 216 from the control circuitry to the laser source) responsive to determining that the amount of light satisfies the shutdown threshold.

In some embodiments, the light received at the second end of the optical waveguide is caused by ignition of contamination (e.g., contamination 112) located the second end of the optical waveguide. This ignition process may emit light with one or more wavelengths that are different from the wavelength of the laser beam. Accordingly, that light can be allowed to pass through to the photodetector (e.g., via mirrors or filters) while preventing the laser beam from reaching the photodetector. In this manner, noise due to the laser beam can be minimized.

In some embodiments, the control circuitry is further configured to determine, using the comparator (e.g., second comparator 410 of voltage comparator circuit 400), whether the amount of light satisfies a secondary threshold (e.g., threshold 312) that is different from (e.g., less than) the shutdown threshold. If the amount of light satisfies the secondary threshold (e.g., and does not satisfy the shutdown threshold), then the control circuitry can perform various functions short of causing the laser source to stop emitting the laser beam. For instance, the control circuitry can decrease a power level of the laser beam or cause the laser source to stop emitting the laser beam for a predetermined amount of time.

As a specific example of a secondary threshold, in some embodiments, the control circuitry is further configured to determine, using the comparator, whether the amount of light satisfies a delayed-shutdown threshold (e.g., threshold 312) for a predetermined amount of time (e.g., 500 ms), where the delayed-shutdown threshold is less than the aforenoted shutdown threshold. If the amount of light satisfies the delayed-shutdown threshold for the predetermined amount of time, then the control circuitry can cause the laser source to stop emitting the laser beam.

In some embodiments, the control circuitry is further configured to, responsive to determining that the amount of light satisfies the shutdown threshold, transmit a message (e.g., display a notification, trigger an alarm, send a text message) to a user of the laser device informing the user that the laser device detected contaminant ignition at the second end of the optical waveguide.

In some embodiments, the control circuitry is configured to, following detection of contaminant ignition, inhibit or terminates the laser output entirely such that the ignited material or contamination fully extinguishes.

In some embodiments, the laser having been inhibited due to a previously detected flare ignition is thereafter held in an inhibited state (e.g., a laser-off state) for a fixed period of time (e.g., 100 ms). Thereafter, the laser is automatically re-enabled such that laser emission renews at the previous setting. The re-enabling of the laser output automatically allows for the surgical procedure to continue with only minimum delay. Such detection of a flare or ignition exceeding at least one comparator threshold may thereafter repeat with control circuitry holding the laser off for the same fixed period and thereafter automatically re-enabling the laser output.

In some embodiments, the laser output is inhibited due to a flare detection where the laser is held in the inhibited state continuously by the control circuitry until the user or clinician acts to reset or re-enable the laser output whether by cycling the laser actuating footswitch or finger button or by resetting a fault on the user interface or GUI touchscreen display.

In other embodiments, the laser inhibit should eliminate laser output rapidly, within less than 10 milliseconds or even within a few microseconds of the comparator threshold being exceeded once either comparator has detected visible light emissions from ignited fiber optic tip surface materials using the photodetector or other light sensing element.

In some embodiments, the message further instructs the user to clean the second end of the optical waveguide or strip and cleave the second end of the optical waveguide. Accordingly, the control circuitry can be further configured to receive a confirmation signal indicating that the user cleaned or stripped the second end of the optical waveguide or an override signal indicating that the user wishes to forgo cleaning or stripping the second end of the optical waveguide. The control circuitry can be further configured to cause the laser source to emit the laser beam only after receiving the confirmation signal or the override signal.

In some embodiments, the laser device further includes a selective turning mirror (e.g., selective turning mirror 204), where the selective turning mirror is configured to reflect the laser beam and further configured to transmit the light emitted from the first end of the optical waveguide. The selective turning mirror can be positioned relative to the first end of the optical waveguide and the laser source such that the laser beam is received at the first end of the optical waveguide after the laser beam is reflected off the selective turning mirror. Additionally, the selective turning mirror can be positioned relative to the photodetector and the first end of the optical waveguide such that the light emitted from the first end of the optical waveguide is received at the photodetector after the light is transmitted through the selective turning mirror.

In some embodiments, the laser device further includes a focusing lens (e.g., focusing lens 206), where the focusing lens is configured to focus the laser beam. The focusing lens can be positioned relative to the first end of the optical waveguide such that the laser beam is focused by the focusing lens before the laser beam is received at the first end of the optical waveguide.

In some embodiments, the laser device further includes an optical filter (e.g., optical filter 208), where the optical filter is configured to reflect the laser beam and transmit the light emitted from the second end of the optical waveguide. The optical filter can be positioned relative to the laser source and the photodetector such that the optical filter prevents some of the laser beam from arriving at the photodetector.

In some embodiments, the photodetector comprises a silicone photodiode configured to generate a voltage proportionate to the amount of light received at the photodetector. Additionally, in some embodiments, the comparator comprises a voltage comparator circuit (e.g., voltage comparator circuit 400) configured to receive the voltage from the silicone photodiode, compare the voltage to a reference voltage (e.g., corresponding to RC pair 404) associated with the shutdown threshold, and output a laser-inhibit signal (e.g., laser-inhibit signals 216 or 412) while the voltage exceeds the reference voltage.

In some embodiments, the laser beam comprises monochromatic light with a power output of approximately 30 watts (e.g., ±3 W) and a wavelength of approximately 455 nanometers (e.g., ±10 nm). Additionally, in some embodiments, the light emitted by the first end of the optical waveguide comprises broadband light with wavelengths between 480 to 880 nanometers.

In some embodiments, the selective turning mirror or the optical filter are coated during a manufacturing process such that the laser beam is reflected or absorbed thereby, respectively. Likewise, in some embodiments, the mirror or the filter are coated during the manufacturing process such that the light emitted from the second end of the optical waveguide is transmitted thereby.

In some embodiments, the control circuitry is configured to cause the laser source to gradually ramp up the power of the laser beam (e.g., from 0-100% power in 500 ms) after stopping emission of the laser beam. This gradual ramping up may occur, for example, after the control circuitry determines that contaminants on the optical waveguide are no longer burning. As another example, the ramping up may occur after the control circuitry receives a confirmation from a user that the user has cleaned or stripped and cleaved the second end of the optical waveguide. As yet another example, the ramping up may occur after the control circuitry receives an override from the user.

In some embodiments, control circuitry uses visible light spectra (e.g., not infrared light) directly from the second end of the optical waveguide and relies on the duration and magnitude thereof to determine whether and to what degree the laser should be inhibited. Whereas infrared light allows for determination of a temperature of the optical waveguide, the visible ignition detector approach provides a superior spectral variation tolerant method to detect ignition of the optical waveguide. Exceptional tolerance for wide variation in ignited material spectra ensures reliable detection of ignition.

In some embodiments, the wide spectral variation tolerance or spectral insensitivity allows for the use of more than one treatment wavelength (e.g., laser beams each with different respective wavelengths), where optical coatings are selected to block or reflect wavelengths of the multiple laser beams from saturating the photodetector, and also where the remaining visible spectra from ignited material light emissions are compared against one or more predetermined thresholds for determining whether to inhibit the treatment and extinguish the ignited contaminants.

For example, a high-power (e.g., 455 nm) laser beam could be combined with another high-power (e.g., 532 nm) laser beam, where the photodiode is protected from wavelengths by means of optic coatings (e.g., on the selective turning mirror or optical filter) that reflect or block both wavelengths from reaching and saturating the photodetector. The turning mirror optical coating could reflect 455 and 532 nanometers (or thereabout) and could pass all other wavelengths, whether longer than 455 nanometers, shorter than 532 nanometers or even therebetween. Likewise, the optical filter could block, reflect, or attenuate both treatment wavelengths.

As another example, a high-power (e.g., 455 nm) laser beam could be combined with another high-power (e.g., 1064 nm) laser beam, where the photodiode is protected from wavelengths by means of optic coatings that reflect or block both wavelengths from reaching and saturating the photodetector. The turning mirror optical coating could reflect 455 and 1064 nanometers (or thereabout) and could pass all other wavelengths, whether longer than 455 nanometers, shorter than 1064 nanometers or even therebetween. Likewise, the optical filter could block, reflect, or attenuate both treatment wavelengths.

In some embodiments, the control circuitry and associated thresholds are configured to capture visible light emitted from ignited material proximal to the emitting tip of the optical waveguide and not the relatively lower-magnitude light reflected or emitted into the optical waveguide, for instance, from a treatment area (e.g., a hospital room). This lower-magnitude light may include light from an endoscope, from other external illumination sources, or from fluorescence from the treatment area stimulated by a probing beam or the like. By monitoring contaminated for ignition-driven visible light with appropriately high enough comparator thresholds, the visible ignition detector rejects or inhibits the detection of other light sources, thereby preventing nuisance faults or false detections of ignition when there is no ignition. The optical waveguide aperture can also limit the angle from which light may enter the end of the optical waveguide such that incoherent light sources originating further away from the tip of the optical waveguide surface ignited material are necessarily of reduced magnitude thereby also reducing the occurrence of false ignition detections from light sources other than fiber tip surface ignited material.

It is noted that the most useful aspects of light emissions or secondary radiation from fiber optic tip surface combustion or ignition for the visible ignition detector is the magnitude and duration of the broad band visible light and not the slope or rate of rise or fall in magnitude as these are subject to variations based on combustibility or ignition. Such light emissions may increase in magnitude slowly or quickly. Many variation in visible light magnitude over time are common such as a brightness or magnitude that gradually grows. Or increase and even intensity or magnitude rapid initial increase then gradual or even quick decay. All of these variations in magnitude over time are addressed with the visible ignition detection apparatus, the detector and comparator(s) in particular, and related software or firmware if any.

In some embodiments, a multiplicity of treatment wavelengths, including infrared treatment wavelengths in some cases, may be used in concert or combination with the visible ignition detector allowing a wide variation in tissue selectivity and thus applicability to various procedures. For instance, tissue selectivity can be accomplished by means of applying differing laser wavelengths such that these differing wavelengths are preferentially absorbed by the target for a given application. This is accomplished by means of optical coatings selected on the for example turning mirror such that treatment wavelengths are reflected from the turning mirror or comparably placed optic and where all or most wavelengths between, above and below the applied treatment wavelengths is propagated to the photodetector for sampling by the comparator with one or more predetermined threshold for determination of ignition of contamination.

Advantages of the Subject Technology. As the visible ignition detector makes use of broad band light emissions to detect ignition of fiber tip contamination, variations in the spectral content of the visible emissions are well tolerated in that detection of ignition is reliable despite variation in spectral content according to certain embodiments. Differing contamination constituents may result in differing spectral content of visible emissions when ignited therefore spectral insensitivity of the visible ignition detector is an advantageous characteristic of the visible ignition detector.

Another aspect of the visible ignition detector is the ability to quickly terminate the ignition such that an otherwise very bright visible flash is largely avoided. This is especially advantageous for applications where the treatment laser is delivered by a user using a microscope to view the treatment area. When viewed under a microscope the ignition initiated bright visible flash or emission can temporarily blind the user and thus impacts the procedure negatively. By quickly terminating the flash the clinician or user is protected from flash blindness or persistent images from the visible flash.

The visible ignition detector has several improvements over conventional surgical laser instruments. The visible ignition detector (VID), according to embodiments of the present disclosure, utilizes a simplified and more efficient optical arrangement wherein the VID reflects the high power treatment laser radiation directly into the fiber focus lens thus avoiding transmission losses caused by any surfaces on any other optics whereas conventional devices propagate the treatment laser through a beam splitter wavelength selective mirror thus incurring unnecessary optical power losses rather than reflecting from the turning mirror as in the VID.

Additionally, the VID turning mirror must necessarily reflect the treatment laser wavelength and it is also configured to act as a treatment laser wavelength filter. It is necessary for devices to remove the treatment laser wavelength from reaching the radiation photodetector to prevent saturation of the detector. Conventional devices may accomplish this by means of a filter and lens system and whereas the VID does this via the turning mirror coating which reflects the treatment wavelength out into the fiber focus. The VID may include an optional treatment laser wavelength filter to attenuate the treatment wavelength. Inclusion of this optional optic allows for greater latitude in selection of acceptable coatings for the VID turning mirror to assuage manufacturing supply availability.

An additional improvement of the VID as compared to conventional devices is the use of a diode that emits at a 455 nm wavelength or at about 455 nm (e.g., 455 nm±10 nm). The 455 nm wavelength provides less absorption in water and greater absorption in the target chromophore of hemoglobin as compared to the 1064 nm used by some conventional devices thus improving target selectivity for the VID. The 455 nm diode laser is also lower cost and much more reliable than a flash lamp driven 1064 nm or any other flash lamp driven solid state laser of comparable power to the 455 nm diode laser.

Another improvement provided by the VID is the use of dual comparators with distinct thresholds and distinct time delays which allows for tuning of the response to various forms of fiber tip contamination ignition. In some cases, ignition may occur and expand near instantaneously whereas in other cases ignition may sputter more or less. Ignition may also occur gradually and or at the very edge of the fiber tip distal surface thusly providing relatively insufficient or below upper threshold amount of broadband light for detection by a radiation detecting photodetector or the like. In these cases the ignition may continue for some time, never or only belatedly (after fiber tip damage or melting has occurred) reaching a detection threshold whereas with a number of comparators of differing time delay and differing threshold as described herein it becomes possible to tailor the response of the treatment laser shut down or inhibition such that larger faster spreading ignitions immediately trigger a higher threshold comparator and where smaller fiber tip surface edge or slower spreading ignitions may trigger a time delayed comparator with a lower threshold which would otherwise be too sensitive with nuisance or false ignition detections for normal use.

While described with dual comparators in fact there could be any number of comparators to provide ignition response tune-ability. A number larger than two of distinct comparators with distinct time delays (RC filters) and distinct thresholds would improve granularity of ignition response adjustability. This greater number of comparators would improve sensitivity and precision especially in the case where ignition detection is used to decrease treatment laser output rather than fully inhibit treatment laser output to append ignition and protect the fiber tip surface.

Ignition threshold detection comparators can be implemented in hardware or software, including firmware. In the case of numerous thresholds with distinct time delays software or firmware implementation could become preferred due to cost, size, etc. Additionally, ignition detection can be done by means of threshold signal comparator or even with a proportional-integral-derivative (PID) control loop, where the PID error amplifier continues to accumulate error as long as the broadband fiber tip contamination ignition light emissions remain. The PID controller provides adjustability or tailoring of the ignition detection response similar to threshold comparators wherein larger ignition detection proportionate wideband light emissions result in a more larger or more rapid swing in PID error levels and resulting output which would drive a more rapid response, a faster inhibition of the treatment laser and where smaller ignition detection signal results in a more moderate swing in PID error levels with a resulting slower to act inhibition of the treatment laser output.

Illustrative Clauses. For further reference, example aspects of the present disclosure are included below as numbered clauses. These clauses are provided for illustrative purposes and are not intended to limit the subject technology.

Clause 1. A laser device comprising: a laser source configured to emit a laser beam; an optical waveguide (e.g., a fiber optic) comprising a first end and a second end, wherein the optical waveguide is configured to (i) emit the laser beam at the second end after receiving the laser beam at the first end and (ii) emit light at the first end after receiving the light at the second end; a selective turning mirror configured to reflect the laser beam and transmit the light emitted from the first end of the optical waveguide; a focusing lens configured to focus the laser beam; an optical filter configured to reflect the laser beam and transmit the light emitted from the first end of the optical waveguide; and control circuitry comprising a photodetector and a comparator, wherein the control circuitry is configured to: detect an amount of light received at the photodetector after the light is emitted from the first end of the optical waveguide; determine, using the comparator, whether the amount of light satisfies (e.g., meets, exceeds) a shutdown threshold; and responsive to determining that the amount of light satisfies the shutdown threshold, cause the laser source to stop emitting the laser beam; wherein the laser source, the selective turning mirror, the focusing lens, the first end of the optical waveguide, the optical filter, and the photodetector are positioned such that (i) after the laser beam is emitted from the laser source, the laser beam reflects off of the selective turning mirror, is focused by the focusing lens, and is received at the first end of the optical waveguide and (ii) after the light is emitted from the first end of the optical waveguide, the light is transmitted through the focusing lens, the selective turning mirror, and the optical filter and received at the photodetector.

Clause 2. A laser device comprising: a laser source configured to emit a laser beam; an optical waveguide (e.g., a fiber optic) comprising a first end and a second end, wherein the optical waveguide is configured to (i) emit the laser beam at the second end after receiving the laser beam at the first end and (ii) emit light at the first end after receiving the light at the second end; and control circuitry comprising a photodetector and a comparator, wherein the control circuitry is configured to: detect an amount of light received at the photodetector after the light is emitted from the first end of the optical waveguide; determine, using the comparator, whether the amount of light satisfies (e.g., meets, exceeds) a shutdown threshold; and responsive to determining that the amount of light satisfies the shutdown threshold, cause the laser source to stop emitting the laser beam.

Clause 3. The laser device of either Clause 1 or 2, wherein the light received at the second end of the optical waveguide is caused by ignition of contamination located the second end of the optical waveguide.

Clause 4. The laser device of any one of Clauses 1 through 3, wherein the control circuitry is further configured to: determine, using the comparator, whether the amount of light satisfies a secondary threshold that is less than the shutdown threshold; and responsive to determining that the amount of light satisfies the secondary threshold but does not satisfy the shutdown threshold, (i) decreasing a power level of the laser beam or (ii) causing the laser source to stop emitting the laser beam.

Clause 5. The laser device of any one of Clauses 1 through 4, wherein the control circuitry is further configured to, responsive to determining that the amount of light satisfies the shutdown threshold, transmit a message to a user of the laser device informing the user that the laser device detected contaminant ignition at the second end of the optical waveguide.

Clause 6. The laser device of Clause 5, wherein: the message further instructs the user to clean the second end of the optical waveguide or strip and cleave the second end of the optical waveguide; and the control circuitry is further configured to: receive (i) a confirmation signal indicating that the user cleaned or stripped the second end of the optical waveguide or (ii) an override signal indicating that the user wishes to forgo cleaning or stripping the second end of the optical waveguide; and cause the laser source to emit the laser beam only after receiving the confirmation signal or the override signal.

Clause 7. The laser device of any one of Clauses 2 through 6, further comprising a selective turning mirror, wherein the selective turning mirror is: configured to reflect the laser beam; further configured to transmit the light emitted from the first end of the optical waveguide; positioned relative to the first end of the optical waveguide and the laser source such that the laser beam is received at the first end of the optical waveguide after the laser beam is reflected off the selective turning mirror; and positioned relative to the photodetector and the first end of the optical waveguide such that the light emitted from the first end of the optical waveguide is received at the photodetector after the light is transmitted through the selective turning mirror.

Clause 8. The laser device of any one of Clauses 2 through 7, further comprising a focusing lens, wherein the focusing lens is: configured to focus the laser beam; and positioned relative to the first end of the optical waveguide such that the laser beam is focused by the focusing lens before the laser beam is received at the first end of the optical waveguide.

Clause 9. The laser device of any one of Clauses 2 through 8, further comprising an optical filter, wherein the optical filter is: configured to reflect the laser beam; and positioned relative to the laser source and the photodetector such that the optical filter prevents some of the laser beam from arriving at the photodetector.

Clause 10. The laser device of any one of Clauses 1 through 9, wherein: the photodetector comprises a silicone photodiode configured to generate a voltage proportionate to the amount of light received at the photodetector; and the comparator comprises a voltage comparator circuit configured to (i) receive the voltage from the silicone photodiode, (ii) compare the voltage to a reference voltage associated with the shutdown threshold, and (iii) output a laser-inhibit signal while the voltage exceeds the reference voltage.

Clause 11. The laser device of any one of Clauses 1 through 10, wherein: the laser beam comprises monochromatic light with a power output of approximately 30 watts and a wavelength of approximately 455 nanometers; and the light emitted by the first end of the optical waveguide comprises broadband light with wavelengths between 480 to 880 nanometers.

Clause 12. A computer-implemented method for operating a laser device configured to detect contaminant ignition and respond thereto, the method comprising: causing a laser source of a laser device to emit a laser beam, wherein the laser device comprises an optical waveguide (e.g., a fiber optic) comprising a first end and a second end, and the optical waveguide is configured to (i) emit the laser beam at the second end after receiving the laser beam at the first end and (ii) emit light at the first end after receiving the light at the second end; detecting an amount of light received at a photodetector of control circuitry of the laser device after the light is emitted from the first end of the optical waveguide; determining, using a comparator of the control circuitry, whether the amount of light satisfies a shutdown threshold; and responsive to determining that the amount of light satisfies the shutdown threshold, causing the laser source to stop emitting the laser beam.

Clause 13. The computer-implemented method of Clause 12, wherein the light received at the second end of the optical waveguide is caused by ignition of contamination located the second end of the optical waveguide.

Clause 14. The computer-implemented method of either Clause 12 or 13, further comprising: determining, using the comparator, whether the amount of light satisfies a secondary threshold that is less than the shutdown threshold; and responsive to determining that the amount of light satisfies the secondary threshold but does not satisfy the shutdown threshold, (i) decreasing a power level of the laser beam or (ii) causing the laser source to stop emitting the laser beam.

Clause 15. The computer-implemented method of any one of Clauses 12 through 14, further comprising, responsive to determining that the amount of light satisfies the shutdown threshold, transmitting a message to a user of the laser device informing the user that the laser device detected contaminant ignition at the second end of the optical waveguide.

Clause 16. The computer-implemented method of Clause 15, wherein: the message further instructs the user to clean the second end of the optical waveguide or strip and cleave the second end of the optical waveguide; and the method further comprises: receiving (i) a confirmation signal indicating that the user cleaned or stripped the second end of the optical waveguide or (ii) an override signal indicating that the user wishes to forgo cleaning or stripping the second end of the optical waveguide; and causing the laser source to emit the laser beam only after receiving the confirmation signal or the override signal.

Clause 17. The computer-implemented method of any one of Clauses 12 through 16, wherein the laser device further comprises a selective turning mirror that is: configured to reflect the laser beam; further configured to transmit the light emitted from the first end of the optical waveguide; positioned relative to the first end of the optical waveguide and the laser source such that the laser beam is received at the first end of the optical waveguide after the laser beam is reflected off the selective turning mirror; and positioned relative to the photodetector and the first end of the optical waveguide such that the light emitted from the first end of the optical waveguide is received at the photodetector after the light is transmitted through the selective turning mirror.

Clause 18. The computer-implemented method of any one of Clauses 12 through 17, wherein the laser device further comprises a focusing lens that is: configured to focus the laser beam; and positioned relative to the first end of the optical waveguide such that the laser beam is focused by the focusing lens before the laser beam is received at the first end of the optical waveguide.

Clause 19. The computer-implemented method of any one of Clauses 12 through 18, wherein the laser device further comprises an optical filter that is: configured to reflect the laser beam; and positioned relative to the laser source and the photodetector such that the optical filter prevents some of the laser beam from arriving at the photodetector.

Clause 20. The computer-implemented method of any one of Clauses 12 through 19, wherein: the photodetector comprises a silicone photodiode configured to generate a voltage proportionate to the amount of light received at the photodetector; and the comparator comprises a voltage comparator circuit configured to (i) receive the voltage from the silicone photodiode, (ii) compare the voltage to a reference voltage associated with the shutdown threshold, and (iii) output a laser-inhibit signal while the voltage exceeds the reference voltage.

Clause 21. The computer-implemented method of any one of Clauses 12 through 20, wherein: the laser beam comprises monochromatic light with a power output of approximately 30 watts and a wavelength of approximately 455 nanometers; and the light emitted by the first end of the optical waveguide comprises broadband light with wavelengths between 480 to 880 nanometers.

Clause 22. A non-transitory, computer-readable medium storing instructions that, when executed by a processor of a laser device, cause the laser device to perform operations including: causing a laser source of the laser device to emit a laser beam, wherein the laser device comprises an optical waveguide (e.g., a fiber optic) comprising a first end and a second end, and the optical waveguide is configured to (i) emit the laser beam at the second end after receiving the laser beam at the first end and (ii) emit light at the first end after receiving the light at the second end; detecting an amount of light received at a photodetector of control circuitry of the laser device after the light is emitted from the first end of the optical waveguide; determining, using a comparator of the control circuitry, whether the amount of light satisfies a shutdown threshold; and responsive to determining that the amount of light satisfies the shutdown threshold, causing the laser source to stop emitting the laser beam.

Clause 23. The non-transitory, computer-readable medium of Clause 22, wherein the light received at the second end of the optical waveguide is caused by ignition of contamination located the second end of the optical waveguide.

Clause 24. The non-transitory, computer-readable medium of either Clause 22 or 23, wherein the operations further comprise: determining, using the comparator, whether the amount of light satisfies a secondary threshold that is less than the shutdown threshold; and responsive to determining that the amount of light satisfies the secondary threshold but does not satisfy the shutdown threshold, (i) decreasing a power level of the laser beam or (ii) causing the laser source to stop emitting the laser beam.

Clause 25. The non-transitory, computer-readable medium of any one of Clauses 22 through 24, wherein the operations further comprise, responsive to determining that the amount of light satisfies the shutdown threshold, transmitting a message to a user of the laser device informing the user that the laser device detected contaminant ignition at the second end of the optical waveguide.

Clause 26. The non-transitory, computer-readable medium of Clause 25, wherein: the message further instructs the user to clean the second end of the optical waveguide or strip and cleave the second end of the optical waveguide; and the operations further comprise: receiving (i) a confirmation signal indicating that the user cleaned or stripped the second end of the optical waveguide or (ii) an override signal indicating that the user wishes to forgo cleaning or stripping the second end of the optical waveguide; and causing the laser source to emit the laser beam only after receiving the confirmation signal or the override signal.

Clause 27. The non-transitory, computer-readable medium of any one of Clauses 22 through 26, wherein the laser device further comprises a selective turning mirror that is: configured to reflect the laser beam; further configured to transmit the light emitted from the first end of the optical waveguide; positioned relative to the first end of the optical waveguide and the laser source such that the laser beam is received at the first end of the optical waveguide after the laser beam is reflected off the selective turning mirror; and positioned relative to the photodetector and the first end of the optical waveguide such that the light emitted from the first end of the optical waveguide is received at the photodetector after the light is transmitted through the selective turning mirror.

Clause 28. The non-transitory, computer-readable medium of any one of Clauses 22 through 27, wherein the laser device further comprises a focusing lens that is: configured to focus the laser beam; and positioned relative to the first end of the optical waveguide such that the laser beam is focused by the focusing lens before the laser beam is received at the first end of the optical waveguide.

Clause 29. The non-transitory, computer-readable medium of any one of Clauses 22 through 28, wherein the laser device further comprises an optical filter that is: configured to reflect the laser beam; and positioned relative to the laser source and the photodetector such that the optical filter prevents some of the laser beam from arriving at the photodetector.

Clause 30. The non-transitory, computer-readable medium of any one of Clauses 22 through 29, wherein: the photodetector comprises a silicone photodiode configured to generate a voltage proportionate to the amount of light received at the photodetector; and the comparator comprises a voltage comparator circuit configured to (i) receive the voltage from the silicone photodiode, (ii) compare the voltage to a reference voltage associated with the shutdown threshold, and (iii) output a laser-inhibit signal while the voltage exceeds the reference voltage.

Clause 31. The non-transitory, computer-readable medium of any one of Clauses 22 through 30, wherein: the laser beam comprises monochromatic light with a power output of approximately 30 watts and a wavelength of approximately 455 nanometers; and the light emitted by the first end of the optical waveguide comprises broadband light with wavelengths between 480 to 880 nanometers.

Clause 32. A method of manufacturing a laser device, the method comprising: providing a laser source configured to emit a laser beam; providing an optical waveguide (e.g., a fiber optic) comprising a first end and a second end, wherein the optical waveguide is configured to (i) emit the laser beam at the second end after receiving the laser beam at the first end and (ii) emit light at the first end after receiving the light at the second end; providing control circuitry comprising a photodetector and a comparator, wherein the control circuitry is configured to (i) detect an amount of light received at the photodetector, (ii) determine, using the comparator, whether the amount of light satisfies a shutdown threshold, and (iii) responsive to determining that the amount of light satisfies the shutdown threshold, cause the laser source to stop emitting the laser beam; positioning the laser source relative to the optical waveguide such that the laser beam is received at the first end of the optical waveguide after the laser beam is emitted by the laser source; positioning the first end of the optical waveguide relative to the photodetector such that the light is received at the photodetector after the light is emitted by the first end of the optical waveguide; and connecting the control circuitry to the laser source such that the control circuitry can cause the laser source to stop emitting the laser beam.

Clause 33. The method of manufacturing of Clause 32, wherein the light received at the second end of the optical waveguide is caused by ignition of contamination located the second end of the optical waveguide.

Clause 34. The method of manufacturing of either Clause 32 or 33, wherein the control circuitry is further configured to: determine, using the comparator, whether the amount of light satisfies a secondary threshold that is less than the shutdown threshold; and responsive to determining that the amount of light satisfies the secondary threshold but does not satisfy the shutdown threshold, (i) decrease a power level of the laser beam or (ii) cause the laser source to stop emitting the laser beam.

Clause 35. The method of manufacturing of any one of Clauses 32 through 34, wherein the control circuitry is further configured to, responsive to determining that the amount of light satisfies the shutdown threshold, transmit a message to a user of the laser device informing the user that the laser device detected contaminant ignition at the second end of the optical waveguide.

Clause 36. The method of manufacturing of Clause 35, wherein: the message further instructs the user to clean the second end of the optical waveguide or strip and cleave the second end of the optical waveguide; and the control circuitry is further configured to: receive (i) a confirmation signal indicating that the user cleaned or stripped the second end of the optical waveguide or (ii) an override signal indicating that the user wishes to forgo cleaning or stripping the second end of the optical waveguide; and cause the laser source to emit the laser beam only after receiving the confirmation signal or the override signal.

Clause 37. The method of manufacturing of any one of Clauses 32 through 36, further comprising: providing a selective turning mirror configured to (i) reflect the laser beam and (ii) transmit the light emitted from the first end of the optical waveguide; and positioning the selective turning mirror (i) relative to the first end of the optical waveguide and the laser source such that the laser beam is received at the first end of the optical waveguide after the laser beam is reflected off the selective turning mirror and (ii) relative to the photodetector and the first end of the optical waveguide such that the light emitted from the first end of the optical waveguide is received at the photodetector after the light is transmitted through the selective turning mirror.

Clause 38. The method of manufacturing of any one of Clauses 32 through 37, further comprising: providing a focusing lens configured to focus the laser beam; and positioning the focusing lens relative to the first end of the optical waveguide such that the laser beam is focused by the focusing lens before the laser beam is received at the first end of the optical waveguide.

Clause 39. The method of manufacturing of any one of Clauses 32 through 38, further comprising: providing an optical filter configured to reflect the laser beam; and positioning the optical filter relative to the laser source and the photodetector such that the optical filter prevents some of the laser beam from arriving at the photodetector.

Clause 40. The method of manufacturing of any one of Clauses 32 through 39, wherein: the photodetector comprises a silicone photodiode configured to generate a voltage proportionate to the amount of light received at the photodetector; and the comparator comprises a voltage comparator circuit configured to (i) receive the voltage from the silicone photodiode, (ii) compare the voltage to a reference voltage associated with the shutdown threshold, and (iii) output a laser-inhibit signal while the voltage exceeds the reference voltage.

Clause 41. The method of manufacturing of any one of Clauses 32 through 40, wherein: the laser beam comprises monochromatic light with a power output of approximately 30 watts and a wavelength of approximately 455 nanometers; and the light emitted by the first end of the optical waveguide comprises broadband light with wavelengths between 480 to 880 nanometers.

Further Consideration. The specific order or hierarchy of steps in the processes disclosed herein is an illustration of example approaches. Based upon design preferences, it is understood that the specific order or hierarchy of steps in the processes may be rearranged. Some of the steps may be performed simultaneously. The accompanying method claims pre-sent elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not in-tended to be limited to the aspects shown herein, but is to be accorded the full scope consistent with the language claims, wherein reference to an element in the singular is not intend-ed to mean "one and only one" unless specifically so stated, but rather "one or more." Unless specifically stated otherwise, the term "some" refers to one or more. Headings and subheadings, if any, are used for convenience only and do not limit the invention described herein.

The predicate words "configured to," "operable to," and "programmed to" do not imply any particular tangible or intangible modification of a subject, but rather are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the subject technology or that such implementation applies to all configurations of the subject technology. A disclosure relating to an implementation may apply to all implementations, or one or more implementations. An implementation may provide one or more examples. A phrase such as "implementations" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

As used herein, the terms "determine" and "determining" encompass a wide variety of actions. For example, "determining" may include calculating, computing, processing, deriving, generating, obtaining, looking up (e.g., looking up in a table, a database or another data structure), ascertaining and the like via a hardware element without user intervention. Also, "determining" may include receiving (e.g., receiving information), accessing (e.g., accessing data in a memory) and the like via a hardware element without user intervention. "Determining" may include resolving, selecting, choosing, establishing, and the like via a hardware element without user intervention.

As used herein, the term "message" encompasses a wide variety of formats for communicating (e.g., transmitting or receiving) information. A message may include a machine readable aggregation of information such as an XML document, fixed field message, comma separated message, JSON, a custom protocol, or the like. A message may, in some embodiments, include a signal utilized to transmit one or more representations of the information. While recited in the singular, it will be understood that a message may be composed, transmitted, stored, received, etc. in multiple parts.

As used herein, the term "selectively" or "selective" may encompass a wide variety of actions. For example, a "selective" process may include determining one option from multiple options. A "selective" process may include one or more of: dynamically determined in-puts, preconfigured inputs, or user-initiated inputs for making the determination. In some embodiments, an n-input switch may be included to provide selective functionality where n is the number of inputs used to make the selection.

As used herein, the terms "correspond" or "corresponding" encompasses a structural, functional, quantitative and/or qualitative correlation or relationship between two or more objects, data sets, information and/or the like, preferably where the correspondence or relationship may be used to translate one or more of the two or more objects, data sets, information and/or the like so to appear to be the same or equal. Correspondence may be assessed using one or more of a threshold, a value range, fuzzy logic, pattern matching, a machine-learning assessment model, or combinations thereof.

In any embodiment, data generated or detected can be forwarded to a "remote" device or location, where "remote," means a location or device other than the location or device at which the program is executed. For example, a remote location could be another location (e.g., office, lab, etc.) in the same city, another location in a different city, another location in a different state, another location in a different country, etc. As such, when one item is indicated as being "remote" from another, what is meant is that the two items can be in the same room but separated, or at least in different rooms or different buildings, and can be at least one mile, ten miles, or at least one hundred miles apart. "Communicating" information references transmitting the data representing that information as electrical signals over a suitable communication channel (e.g., a private or public network). "Forwarding" an item refers to any means of getting that item from one location to the next, whether by physically transporting that item or otherwise (where that is possible) and includes, at least in the case of data, physically transporting a medium carrying the data or communicating the data. Examples of communicating media include radio or infra-red transmission channels as well as a network connection to another computer or networked device, and the internet or including email transmissions and information recorded on websites and the like.

What is claimed is:

1. A laser device comprising:
   a laser source configured to emit a laser beam comprising monochromatic light with a power output between 20-40 watts and a wavelength between 445-465 nanometers;
   an optical waveguide comprising a first end and a second end, wherein the optical waveguide is configured to (i) emit the laser beam at the second end after receiving the laser beam at the first end and (ii) emit light at the first end after receiving the light at the second end, wherein the light emitted from the first end of the optical waveguide comprises broadband light with wavelengths between 480 and 880 nanometers;
   a selective turning mirror configured to reflect the laser beam and transmit the light emitted from the first end of the optical waveguide;
   a focusing lens configured to focus the laser beam;
   an optical filter configured to reflect the laser beam and transmit the light emitted from the first end of the optical waveguide; and
   control circuitry comprising a photodetector and a comparator, wherein the control circuitry is configured to:
   detect an amount of light received at the photodetector after the light is emitted from the first end of the optical waveguide;
   determine, using the comparator, whether the amount of light satisfies a shutdown threshold; and
   responsive to determining that the amount of light satisfies the shutdown threshold, cause the laser source to stop emitting the laser beam;
   wherein the laser source, the selective turning mirror, the focusing lens, the first end of the optical waveguide, the optical filter, and the photodetector are positioned such that (i) after the laser beam is emitted from the laser source, the laser beam reflects off of the selective turning mirror, is focused by the focusing lens, and is received at the first end of the optical waveguide and (ii) after the light is emitted from the first end of the optical waveguide, the light is transmitted through the focusing lens, the selective turning mirror, and the optical filter and received at the photodetector.

2. A laser device comprising:
   a laser source configured to emit a laser beam comprising monochromatic light with a power output between 20-40 watts and a wavelength between 445-465 nanometers;
   an optical waveguide comprising a first end and a second end, wherein the optical waveguide is configured to (i) emit the laser beam at the second end after receiving the laser beam at the first end and (ii) emit light at the first end after receiving the light at the second end, wherein the light emitted from the first end of the optical waveguide comprises broadband light with wavelengths between 480 and 880 nanometers; and
   control circuitry comprising a photodetector and a comparator, wherein the control circuitry is configured to:
   detect an amount of light received at the photodetector after the light is emitted from the first end of the optical waveguide;
   determine, using the comparator, whether the amount of light satisfies a shutdown threshold; and
   responsive to determining that the amount of light satisfies the shutdown threshold, cause the laser source to stop emitting the laser beam.

3. The laser device of claim 2, wherein the light received at the second end of the optical waveguide is caused by ignition of contamination located the second end of the optical waveguide.

4. The laser device of claim 2, wherein the control circuitry is further configured to:
   determine, using the comparator, whether the amount of light satisfies a secondary threshold that is less than the shutdown threshold; and
   responsive to determining that the amount of light satisfies the secondary threshold but does not satisfy the shutdown threshold, (i) decreasing a power level of the laser beam or (ii) causing the laser source to stop emitting the laser beam.

5. The laser device of claim 2, wherein the control circuitry is further configured to, responsive to determining that the amount of light satisfies the shutdown threshold, transmit a message to a user of the laser device informing the user that the laser device detected contaminant ignition at the second end of the optical waveguide.

6. The laser device of claim 5, wherein:
   the message further instructs the user to clean the second end of the optical waveguide or strip and cleave the second end of the optical waveguide; and the control circuitry is further configured to:
  receive (i) a confirmation signal indicating that the user cleaned or stripped the second end of the optical waveguide or (ii) an override signal indicating that the user wishes to forgo cleaning or stripping the second end of the optical waveguide; and
  cause the laser source to emit the laser beam only after receiving the confirmation signal or the override signal.

7. The laser device of claim 2, further comprising:
a selective turning mirror configured to reflect the laser beam and transmit the light emitted from the first end of the optical waveguide, wherein the selective turning mirror is:
  positioned relative to the first end of the optical waveguide and the laser source such that the laser beam is received at the first end of the optical waveguide after the laser beam is reflected off the selective turning mirror; and
  positioned relative to the photodetector and the first end of the optical waveguide such that the light emitted from the first end of the optical waveguide is received at the photodetector after the light is transmitted through the selective turning mirror.

8. The laser device of claim 2, further comprising:
a focusing lens configured to focus the laser beam, wherein the focusing lens is positioned relative to the first end of the optical waveguide such that the laser beam is focused by the focusing lens before the laser beam is received at the first end of the optical waveguide.

9. The laser device of claim 2, further comprising:
an optical filter configured to reflect the laser beam, wherein the optical filter is positioned relative to the laser source and the photodetector such that the optical filter prevents some of the laser beam from arriving at the photodetector.

10. The laser device of claim 2, wherein:
the photodetector comprises a silicone photodiode configured to generate a voltage proportionate to the amount of light received at the photodetector; and
the comparator comprises a voltage comparator circuit configured to (i) receive the voltage from the silicone photodiode, (ii) compare the voltage to a reference voltage associated with the shutdown threshold, and (iii) output a laser-inhibit signal while the voltage exceeds the reference voltage.

11. A computer-implemented method for operating a laser device configured to detect contaminant ignition and respond thereto, the method comprising:
  causing a laser source of a laser device to emit a laser beam comprising monochromatic light with a power output between 20-40 watts and a wavelength between 445-465 nanometers, wherein the laser device comprises an optical waveguide comprising a first end and a second end, and the optical waveguide is configured to (i) emit the laser beam at the second end after receiving the laser beam at the first end and (ii) emit light at the first end after receiving the light at the second end, wherein the light emitted from the first end of the optical waveguide comprises broadband light with wavelengths between 480 and 880 nanometers;
  detecting an amount of light received at a photodetector of control circuitry of the laser device after the light is emitted from the first end of the optical waveguide;
  determining, using a comparator of the control circuitry, whether the amount of light satisfies a shutdown threshold; and
  responsive to determining that the amount of light satisfies the shutdown threshold, causing the laser source to stop emitting the laser beam.

12. The computer-implemented method of claim 11, wherein the light received at the second end of the optical waveguide is caused by ignition of contamination located the second end of the optical waveguide.

13. The computer-implemented method of claim 11, further comprising:
  determining, using the comparator, whether the amount of light satisfies a secondary threshold that is less than the shutdown threshold; and
  responsive to determining that the amount of light satisfies the secondary threshold but does not satisfy the shutdown threshold, (i) decreasing a power level of the laser beam or (ii) causing the laser source to stop emitting the laser beam.

14. The computer-implemented method of claim 11, further comprising, responsive to determining that the amount of light satisfies the shutdown threshold, transmitting a message to a user of the laser device informing the user that the laser device detected contaminant ignition at the second end of the optical waveguide.

15. The computer-implemented method of claim 14, wherein:
  the message further instructs the user to clean the second end of the optical waveguide or strip and cleave the second end of the optical waveguide; and
  the method further comprises:
    receiving (i) a confirmation signal indicating that the user cleaned or stripped the second end of the optical waveguide or (ii) an override signal indicating that the user wishes to forgo cleaning or stripping the second end of the optical waveguide; and
    causing the laser source to emit the laser beam only after receiving the confirmation signal or the override signal.

16. The computer-implemented method of claim 11, wherein:
  the laser device further comprises a selective turning mirror configured to reflect the laser beam and transmit the light emitted from the first end of the optical waveguide, wherein the selective turning mirror is:
    positioned relative to the first end of the optical waveguide and the laser source such that the laser beam is received at the first end of the optical waveguide after the laser beam is reflected off the selective turning mirror; and
    positioned relative to the photodetector and the first end of the optical waveguide such that the light emitted from the first end of the optical waveguide is received at the photodetector after the light is transmitted through the selective turning mirror.

17. The computer-implemented method of claim 11, wherein:
  the laser device further comprises a focusing lens configured to focus the laser beam, wherein the focusing lens is positioned relative to the first end of the optical waveguide such that the laser beam is focused by the focusing lens before the laser beam is received at the first end of the optical waveguide.

18. The computer-implemented method of claim 11, wherein:
the laser device further comprises an optical filter configured to reflect the laser beam, wherein the optical filter is positioned relative to the laser source and the photodetector such that the optical filter prevents some of the laser beam from arriving at the photodetector.

19. The computer-implemented method of claim 11, wherein:
the photodetector comprises a silicone photodiode configured to generate a voltage proportionate to the amount of light received at the photodetector; and
the comparator comprises a voltage comparator circuit configured to (i) receive the voltage from the silicone photodiode, (ii) compare the voltage to a reference voltage associated with the shutdown threshold, and (iii) output a laser-inhibit signal while the voltage exceeds the reference voltage.

20. A method of manufacturing a laser device, the method comprising:
providing a laser source configured to emit a laser beam comprising monochromatic light with a power output between 20-40 watts and a wavelength between 445-465 nanometers;
providing an optical waveguide comprising a first end and a second end, wherein the optical waveguide is configured to (i) emit the laser beam at the second end after receiving the laser beam at the first end and (ii) emit light at the first end after receiving the light at the second end, wherein the light emitted from the first end of the optical waveguide comprises broadband light with wavelengths between 480 and 880 nanometers;
providing control circuitry comprising a photodetector and a comparator, wherein the control circuitry is configured to (i) detect an amount of light received at the photodetector, (ii) determine, using the comparator, whether the amount of light satisfies a shutdown threshold, and (iii) responsive to determining that the amount of light satisfies the shutdown threshold, cause the laser source to stop emitting the laser beam;
positioning the laser source relative to the optical waveguide such that the laser beam is received at the first end of the optical waveguide after the laser beam is emitted by the laser source;
positioning the first end of the optical waveguide relative to the photodetector such that the light is received at the photodetector after the light is emitted by the first end of the optical waveguide; and
connecting the control circuitry to the laser source such that the control circuitry can cause the laser source to stop emitting the laser beam.

21. The method of manufacturing of claim 20, wherein the control circuitry is further configured to:
determine, using the comparator, whether the amount of light satisfies a secondary threshold that is less than the shutdown threshold; and responsive to determining that the amount of light satisfies the secondary threshold but does not satisfy the shutdown threshold, (i) decrease a power level of the laser beam or (ii) cause the laser source to stop emitting the laser beam.

22. The method of manufacturing of claim 20, wherein the control circuitry is further configured to, responsive to determining that the amount of light satisfies the shutdown threshold, transmit a message to a user of the laser device informing the user that the laser device detected contaminant ignition at the second end of the optical waveguide.

23. The method of manufacturing of claim 22, wherein:
the message further instructs the user to clean the second end of the optical waveguide or strip and cleave the second end of the optical waveguide; and
the control circuitry is further configured to:
receive (i) a confirmation signal indicating that the user cleaned or stripped the second end of the optical waveguide or (ii) an override signal indicating that the user wishes to forgo cleaning or stripping the second end of the optical waveguide; and
cause the laser source to emit the laser beam only after receiving the confirmation signal or the override signal.

24. The method of manufacturing of claim 20, further comprising:
providing a selective turning mirror configured to (i) reflect the laser beam and (ii) transmit the light emitted from the first end of the optical waveguide; and
positioning the selective turning mirror (i) relative to the first end of the optical waveguide and the laser source such that the laser beam is received at the first end of the optical waveguide after the laser beam is reflected off the selective turning mirror and (ii) relative to the photodetector and the first end of the optical waveguide such that the light emitted from the first end of the optical waveguide is received at the photodetector after the light is transmitted through the selective turning mirror.

25. The method of manufacturing of claim 20, further comprising:
providing a focusing lens configured to focus the laser beam; and
positioning the focusing lens relative to the first end of the optical waveguide such that the laser beam is focused by the focusing lens before the laser beam is received at the first end of the optical waveguide.

26. The method of manufacturing of claim 20, further comprising:
providing an optical filter configured to reflect the laser beam; and
positioning the optical filter relative to the laser source and the photodetector such that the optical filter prevents some of the laser beam from arriving at the photodetector.

27. The method of manufacturing of claim 20, wherein:
the photodetector comprises a silicone photodiode configured to generate a voltage proportionate to the amount of light received at the photodetector; and
the comparator comprises a voltage comparator circuit configured to (i) receive the voltage from the silicone photodiode, (ii) compare the voltage to a reference voltage associated with the shutdown threshold, and (iii) output a laser-inhibit signal while the voltage exceeds the reference voltage.

* * * * *